(12) United States Patent
Kaajakari

(10) Patent No.: US 10,778,184 B2
(45) Date of Patent: Sep. 15, 2020

(54) MEMS RESONATOR WITH A HIGH QUALITY FACTOR

(71) Applicant: Murata Manufacturing Co., Ltd., Nagaokakyo-shi, Kyoto-fu (JP)

(72) Inventor: Ville Kaajakari, Altedena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 313 days.

(21) Appl. No.: 15/807,778

(22) Filed: Nov. 9, 2017

(65) Prior Publication Data

US 2018/0069527 A1 Mar. 8, 2018

Related U.S. Application Data

(63) Continuation of application No. PCT/US2016/033929, filed on May 24, 2016, which is a continuation of application No. 14/722,323, filed on May 27, 2015, now abandoned.

(51) Int. Cl.
| | |
|---|---|
| *H03H 9/17* | (2006.01) |
| *H03H 9/02* | (2006.01) |
| *H03H 9/24* | (2006.01) |
| *H03H 9/15* | (2006.01) |

(52) U.S. Cl.
CPC ........ *H03H 9/171* (2013.01); *H03H 9/02228* (2013.01); *H03H 9/02433* (2013.01); *H03H 2009/0244* (2013.01); *H03H 2009/02496* (2013.01); *H03H 2009/155* (2013.01); *H03H 2009/241* (2013.01)

(58) Field of Classification Search
CPC combination set(s) only.
See application file for complete search history.

(56) References Cited

U.S. PATENT DOCUMENTS

| | | |
|---|---|---|
| 6,437,482 B1 | 8/2002 | Shibata |
| 7,924,119 B1 | 4/2011 | Ayazi et al. |
| 8,004,165 B2 | 8/2011 | Furuhata et al. |
| 8,222,970 B2 | 7/2012 | Inoue et al. |
| 8,304,967 B2 | 11/2012 | Takizawa |

(Continued)

FOREIGN PATENT DOCUMENTS

| | | |
|---|---|---|
| JP | 2008048315 A | 2/2008 |
| JP | 2015088521 A | 5/2015 |

OTHER PUBLICATIONS

Gianluca Piazza et at: "Piezoelectric Aluminum Nitride Vibrating Contour-Mode MEMS Resonators"; Journal of Microelectromechanical Systems, vol. 15, No. 6, Dec. 2006. pp. 1406-1418.

(Continued)

*Primary Examiner* — Bryan P Gordon
(74) *Attorney, Agent, or Firm* — Arent Fox LLP

(57) ABSTRACT

A symmetrical MEMS resonator is disclosed with a high quality factor. The MEMS resonator includes a silicon layer with a top surface and bottom surface opposite the top surface. A pair of first metal layers is provided above the top surface of the silicon layer and a corresponding pair of second metal layers is symmetrically provided below the second surface of the silicon layer relative to the pair of first metal layers. Furthermore, a first piezoelectric layer is disposed between the pair of first metal layers and a second piezoelectric layer is disposed between the pair of second metal layers.

21 Claims, 6 Drawing Sheets

(56) References Cited

U.S. PATENT DOCUMENTS

| | | | |
|---|---|---|---|
| 8,310,129 B2 | 11/2012 | Defay et al. | |
| 8,587,391 B2 | 1/2013 | Gilbert et al. | |
| 8,519,598 B1 | 6/2013 | Ayazi et al. | |
| 2006/0158283 A1* | 7/2006 | Hikita | H03H 9/178 |
| | | | 333/187 |
| 2008/0119003 A1 | 5/2008 | Grosjean | |
| 2009/0174291 A1 | 7/2009 | Nagano | |
| 2010/0231659 A1 | 9/2010 | Ohta | |
| 2011/0121689 A1 | 5/2011 | Grannen et al. | |
| 2011/0248606 A1* | 10/2011 | Yamada | H03H 9/02062 |
| | | | 310/361 |
| 2011/0273061 A1* | 11/2011 | Thalmayr | H01L 41/253 |
| | | | 310/346 |
| 2011/0304412 A1 | 12/2011 | Zhang | |
| 2013/0106534 A1 | 5/2013 | Burak et al. | |
| 2013/0214643 A1 | 8/2013 | Zuo et al. | |
| 2014/0265726 A1 | 9/2014 | Andosca | |
| 2016/0065169 A1* | 3/2016 | Rinaldi | H03H 3/02 |
| | | | 250/338.3 |
| 2016/0240768 A1* | 8/2016 | Fujii | H01L 41/0973 |

OTHER PUBLICATIONS

Ville Kaajakari et al.; "Square-Extensional Mode Single-Crystal Silicon Micromechanical Resonator for Low-Phase-Noise Oscillator Applications": IEEE Electron Device Letters, vol. 25, No. 4, Apr. 2004, pp. 173-175.

International Search Report issued for PCT/US2016/033929, dated Sep. 1, 2016.

Written Opinion of the International Searching Authority issued for PCT/US2016/0333929, dated Sep. 1, 2016.

* cited by examiner

MEMS RESONATOR WITH A HIGH QUALITY FACTOR

The present application is a continuation of PCT/US2016/033929 filed May 24, 2016, which claims priority to U.S. patent application Ser. No. 14/722,323, filed May 27, 2015, the entire contents of each of which are incorporated herein by reference.

FIELD OF THE INVENTION

The present invention relates to a MEMS resonator, and, more particular, to a MEMS resonator with a high quality factor.

BACKGROUND OF THE INVENTION

Microelectromechanical system ("MEMS") resonators are small electromechanical structures that vibrate at high frequencies and are often used for timing references, signal filtering, mass sensing, biological sensing, motion sensing, and other applications. MEMS resonators are considered a common alternative to quartz timing devices. In general, quartz resonators have a good quality factor and piezoelectric coupling, but one limitation for quartz resonators is that they are difficult to design in smaller sizes.

Typically, MEMS resonators are made of silicon using lithography based manufacturing processes and wafer level processing techniques. Designers have found that pure silicon resonators often demonstrate very high quality factors comparable to quartz crystals, for example, as described in Non-patent document 1 (identified below). However, bare silicon is not piezoelectric and pure silicon resonators have high motional impedance making them unsuitable to replace quartz resonators in many applications.

In order to lower the motional impedance of MEMS resonator, some designs have added piezoelectric material, such as a layer of thin film of aluminum nitride (AlN), as described in Non-patent document 2 (identified below), for example. In a typical piezoelectric MEMS resonator, a thin film of molybdenum may be sputtered onto the silicon followed by a layer of AlN and an additional layer of molybdenum. After thin film deposition, the metal layers, the AlN layer and the silicon are etched to form the resonator shape. With the resulting design, the lower and upper layers of molybdenum serve as electrodes to excite and detect the mechanical vibrations of the resonator.

FIG. 1 illustrates a conventional micromechanical bulk acoustic resonator. As shown, the bulk acoustic resonator includes silicon layers 11 and 13 with an insulator 12 disposed therebetween. Moreover, two metal layers 14, 16 are disposed on top of silicon substrate 13 with a piezoelectric film 15 disposed therebetween. The metal layer 16 forms conductive electrodes 16 that are coupled by way of tethers 17 to conduct pads 16a and 16b. One limitation with this design is that the addition of the piezoelectric film 15 and the metal layers 14 and 16 on top of the silicon 13 breaks the symmetry of the resonator 10. In other words, the top of silicon is dissimilar to the bottom of silicon. The asymmetrical design causes vibrations in the thickness direction of the resonator that result in energy leakage out of the resonator.

FIGS. 2A and 2B illustrate a comparison of vibration between a pure silicon resonator and a silicon resonator with thin films deposited on a top surface of the silicon layer. In both FIGS. 2A and 2B, the dashed outline represents the device in its original position with no vibration. FIG. 2A illustrates a pure silicon resonator 110 having an anchor center point 120. In vibration mode, the device 110 expands and contracts as shown in the two images of FIG. 2A, but there is no movement in the z direction, i.e., the anchor center point 120 does not move up or down while vibrating. FIG. 2B illustrates a resonator design that includes thin films (e.g., the piezoelectric layer and metal layers) 112 disposed on top of the silicon substrate. The piezoelectric and metal films have different elastic modulus and density than silicon. Because the symmetry is broken, the resonator bends and there will be vibration movement in the z direction, i.e., the anchor center point 120 will move up or down while vibrating. As a result, piezoelectric MEMS resonator designs, such as those shown in FIGS. 1 and 2B, will typically have a quality factor that is about an order of magnitude lower than bare silicon resonators, such as the device shown in FIG. 2A, at the same frequency. The low quality factor of the piezoelectric MEMS resonator designs increases the noise in oscillator applications and increases the motional impedance.

One design that attempts to overcome the low quality factor of piezoelectric MEMS resonators is to increase the size of the resonator by using a higher order overtone design, for example, as described in Patent document 1 (identified below). While a higher order overtone design directly decreases the motional resistance, it also increases the size of the resonator. Moreover, since the manufacturing cost of the resonator is proportional to the size, the larger resonator size is not preferred. In addition, even for larger resonators, the low motional impedance is still not sufficient for low noise oscillator applications and a higher quality factor is required.

Non patent document 1: V. Kaajakari, T. Mattila, A. Oja, J. Kiihamaki, and H. Seppa, "Square-extensional mode single-crystal silicon micromechanical resonator for low phase noise oscillator applications", IEEE Electron Device Letters, Vol. 25, No. 4, pp. 173-175, April 2004.

Non patent document 2: G. Piazza, P. J. Stephanou, A. P. Pisano, "Piezoelectric Aluminum Nitride Vibrating Contour-Mode MEMS Resonators", Journal of Micro-Electro Mechanical Systems, vol. 15, no. 6, pp. 1406-1418, December 2006.

Patent document 1: U.S. Pat. No. 7,924,119.

SUMMARY OF THE INVENTION

Accordingly, the MEMS resonator according to the present disclosure increases the quality factor of the resonator that results in lower motional impedance without increasing the resonator size.

A MEMS resonator according to the present invention includes a silicon layer having a first surface and a second surface opposite the first surface; at least one metal layer disposed above the first surface of the silicon layer and at least one corresponding metal layer disposed below the second surface of the silicon layer; and a piezoelectric layer disposed above the first surface of the silicon layer and a corresponding piezoelectric layer disposed below the second surface of the silicon layer.

With the symmetrical or substantially symmetrical design of the MEMS resonator in the thickness direction, the MEMS resonator provides a high quality factor compared with conventional MEMS resonators because it does not move in the z direction during vibration mode.

According to one embodiment, the at least one metal layer and the at least one corresponding metal layer are symmetrically disposed with respect to each other about the silicon layer and the piezoelectric layer and the corresponding piezoelectric layer are symmetrically disposed with respect to each other about the silicon layer.

According to another embodiment, the at least one metal layer comprises a pair of first metal layers with the piezoelectric layer disposed therebetween and the at least one corresponding metal layer comprises a pair of second metal layers with the corresponding piezoelectric layer disposed therebetween.

According to another embodiment, the pair of first metal layers and the piezoelectric layer is symmetrically disposed about the silicon layer with respect to the pair of second metal layers and the corresponding piezoelectric layer.

According to another embodiment, the pair of first metal layers is electrically coupled to a voltage source to actuate the MEMS resonator and the pair of second metal layers is electrically insulated from the voltage source.

According to yet another embodiment, the pair of second metal layers is electrically coupled to the voltage source.

According to another embodiment, the piezoelectric layer comprises a thickness substantially equal to a thickness of the corresponding piezoelectric layer and the pair of first metal layers each comprises a thickness substantially equal to respective thicknesses of the pair of second metal layers.

According to one embodiment, the silicon layer comprises a thickness between 5 and 30 micrometers.

A MEMS resonator according to another embodiment of the present invention includes a silicon layer having a first surface and a second surface opposite the first surface; a pair of first metal layers disposed above the first surface of the silicon layer; a first piezoelectric layer disposed between the pair of first metal layers; a pair of second metal layers symmetrically disposed below the second surface of the silicon layer relative to the pair of first metal layers; and a second piezoelectric layer disposed between the pair of second metal layers.

A MEMS resonator according to another embodiment of the present invention includes a silicon layer having a first surface and a second surface opposite the first surface; a pair of first metal layers disposed above the first surface of the silicon layer; a first piezoelectric layer having a first thickness disposed between the pair of first metal layers; and a second piezoelectric layer disposed below the second surface of the silicon layer, wherein the second piezoelectric layer comprises a second thickness greater than the first thickness of the first piezoelectric layer to inhibit vibration in a thickness direction of the MEMS resonator when the pair of first metal layers are excited by a voltage source.

According to another embodiment, the pair of first metal layers and the first piezoelectric layer have a combined mechanical stiffness that is substantially equal to a mechanical stiffness of the second piezoelectric layer.

According to yet another embodiment, the combined mechanical stiffness of the pair of first metal layers and the first piezoelectric layer is within 10% MPa*m of the mechanical stiffness of the second piezoelectric layer.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION OF THE EXEMPLARY EMBODIMENTS

Example aspects are described herein in the context of a MEMS resonator. Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1:
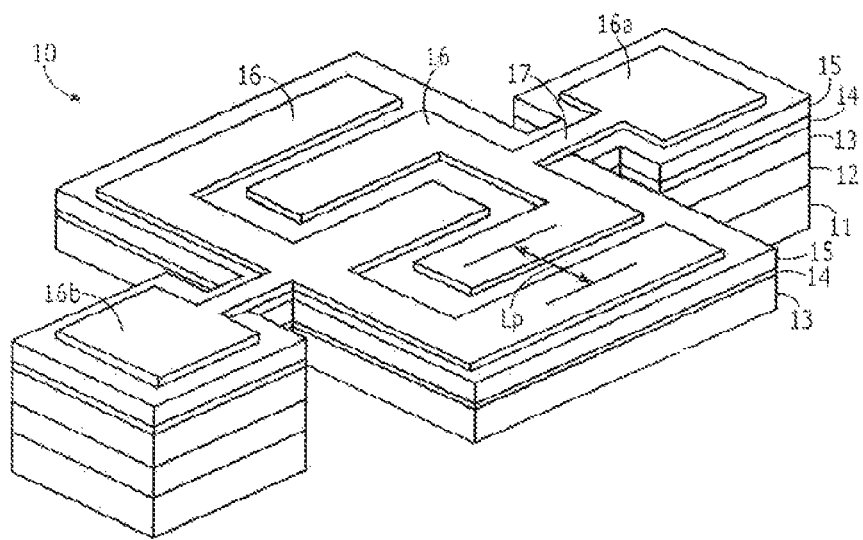
FIG. 1 illustrates a conventional micromechanical bulk acoustic resonator.
Figure 2A:
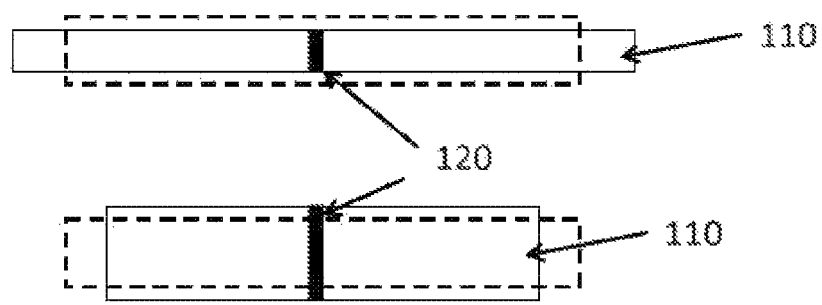
FIGS. 2A and 2B illustrate a comparison of vibration between a pure silicon resonator and a silicon resonator with thin films disposed on a top surface of the silicon layer.
Figure 2B:
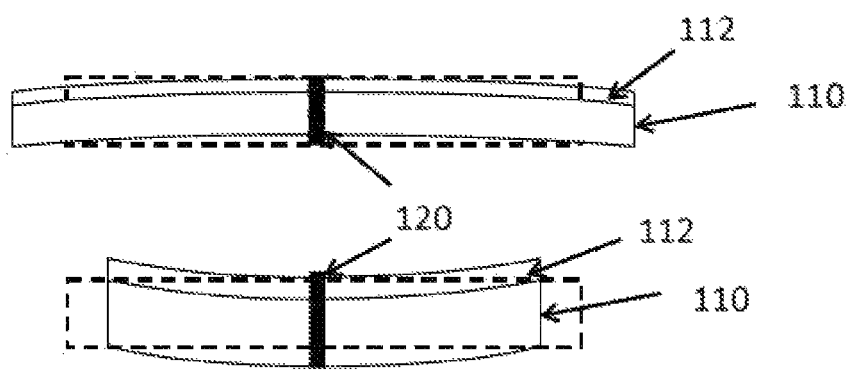
Figure 3A:
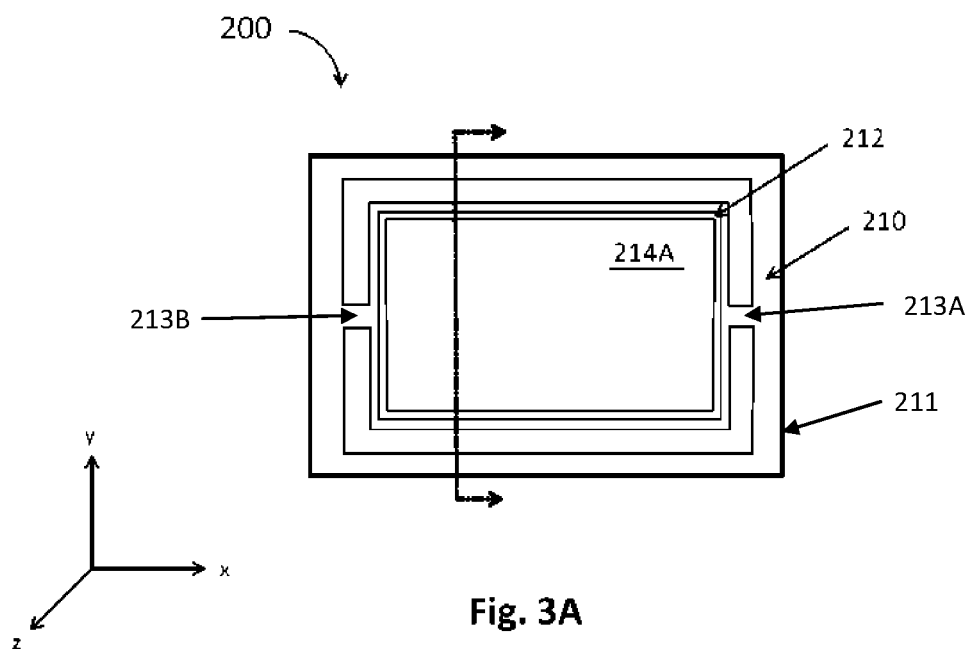
FIG. 3A illustrates a top view of a MEMS resonator according to a first exemplary embodiment.

FIG. 3A illustrates a top view of a MEMS resonator according to a first exemplary embodiment. According to the exemplary embodiment, a MEMS resonator 200 is disclosed that provides a high quality factor of silicon by maintaining symmetry of the resonator in the thickness direction. The symmetrical design can readily be seen in FIG. 3B and will be discussed in more detail below.

Figure 3B:
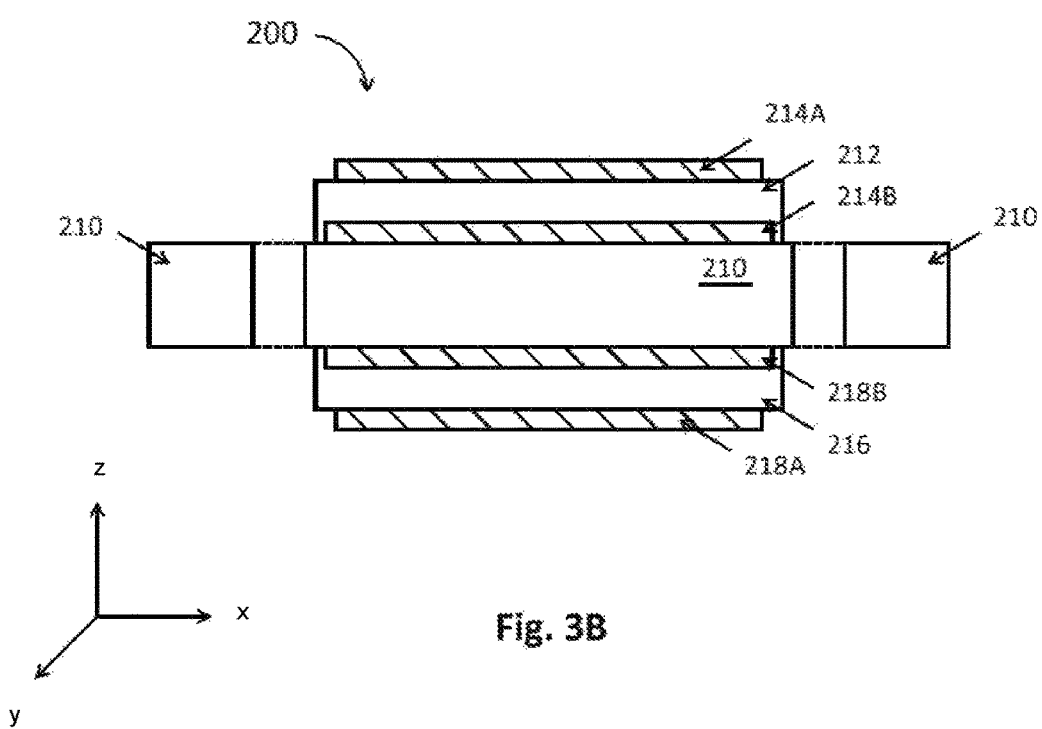
FIG. 3B illustrates a cross-sectional view of the MEMS resonator according to the first exemplary embodiment as shown in FIG. 2A.

As shown in FIG. 3A, the MEMS resonator 200 includes a silicon layer 210 with a top or first piezoelectric layer 212 disposed above the silicon layer 210. Furthermore, a top metal layer 214A is disposed on the first piezoelectric layer 212 that serves as one of a pair of electrodes in operation of the MEMS resonator 200 according to the exemplary embodiment. The first piezoelectric layer 212 and the top metal layer 214A are formed on a inner portion of the silicon layer 210 that is coupled to a frame 11 by a pair of connecting arms 213A and 213B in a lateral direction thereof (i.e., the X, Y plane). Due to the symmetrical design that is shown in FIG. 3B discussed below, the MEMS resonator 200 will vibrate in the X and Y plane during operation, but will have reduced or minimal motional impedance. That is, the symmetrical design of the MEMS resonator 200 prevents or reduces vibration in the Z plane.

FIG. 3B illustrates a cross-sectional view of the symmetrical design of the MEMS resonator 200 according to the first exemplary embodiment as shown in FIG. 3A. It should be readily apparent that the cross-sectional view is taken along the dashed lines shown in FIG. 3A.

As described above, the MEMS resonator 200 includes a silicon layer 210, a top piezoelectric layer 212 and a top metal layer 214A. In addition, a bottom metal layer 214B is disposed on the silicon layer 210, which, in conjunction with the top metal layer 214A, collectively form a first pair of electrodes that serve as electrodes to excite and detect the mechanical vibrations of the resonator 200. Thus, according to the exemplary embodiment, a pair of metal layers 214A and 214B is disposed above the silicon layer 210 with the top or first piezoelectric layer 212 disposed therebetween. Preferably, the metal layer 214 is disposed directly on the silicon layer 210, although additional silicon dioxide ($SiO_2$) films (not shown) can be disposed between the various layers of the MEMS device 200.

Preferably, the MEMS resonator 200 is formed to have a complete symmetrical design in the thickness direction, i.e., in the Z direction as shown in FIG. 3B. To form the symmetrical design of the MEMS resonator 200, additional layers that correspond to the piezoelectric layer 212 and pair of metal layers 214A and 214B are disposed on the opposite side of the silicon layer 210. More particularly, opposite the piezoelectric and metal layers on the first surface of the silicon layer 210, a corresponding second pair of metal layers 218A and 218B are disposed with corresponding a second piezoelectric layer 216 disposed therebetween as shown. In other words, the second pair of metal layers 218A and 218B are symmetrical and directly correspond to the first pair of metal layers 214A and 214B. Likewise, the second piezoelectric layer 216 is symmetrically disposed and directly corresponds to the first piezoelectric layer 212.

As is readily apparent from the cross-sectional view illustrated in FIG. 3B, the MEMS resonator 200 comprises a symmetrical or substantially symmetrical design in the thickness direction, which provides a high quality factor when compared with conventional MEMS resonators because it does not move in the z direction (or has minimal movement compared with conventional designs) during vibration mode. Thus, according to the exemplary embodiment, metal layer 218A corresponds to metal layer 214A, piezoelectric layer 216 corresponds to piezoelectric layer 212, and metal layer 218B corresponds to metal layer 214B.

According to an exemplary embodiment, the metal layers 214A, 214B, 218A and 218B are formed from molybdenum, although other metal layers, such as platinum, aluminum and the like can be deposited as would be understood to one skilled in the art. Moreover, the piezoelectric layers 212 and 216 are each formed from a thin layer of aluminum nitride (AlN) according to the exemplary embodiment, although other piezoelectric materials may be used. It should be understood that the MEMS resonator 200 can be manufactured using conventional sputtering and deposition techniques, the details of which will not be described in detail so as to not unnecessarily obscure the aspects of the invention.

The symmetrical MEMS resonator design shown in FIGS. 3A and 3B provides an increased quality factor that results in lower motional impedance. Moreover, according to the symmetrical design, the MEMS resonator 200 is configured to vibrate "in-plane" when the electrodes (i.e., either of the pair of metal layers 214A and 214B and/or the pair of metal layers 218A and 218B) are excited during operation of the MEMS resonator 200. As a result, the MEMS resonator 200 will have a primary vibrational mode in the lateral direction, i.e., the in Y direction and in the X/Y plane as shown in either of FIGS. 3A and/or 3B, while minimizing vibration in the vertical direction, i.e., in the Z plane. Thus, in the exemplary embodiment, the MEMS resonator 200 will vibrate in the X/Y plane, which extends in a direction parallel to the first and second principal surfaces of the silicon layer 210.

Moreover, according to the exemplary embodiment, the silicon layer has a thickness between 5-30 micrometers (μm), and, preferably between 5-10 micrometers according to a refinement of the embodiment. In contrast, conventional MEMS resonator designs must increase the thickness of the silicon layer, for example, to 50 micrometers or more in order to obtain a resonator with a sufficiently high quality factor for certain applications. Such an increase in size of the silicon layer would significantly increase manufacturing costs as would be understood to one skilled in the art.

For example, an asymmetric resonator with top piezoelectric film and 10 micrometers silicon thickness may have a quality factor of only 10,000 at 24 MHz. In contrast, a pure silicon resonator may have a quality factor of over 100,000. For an asymmetric resonator with a thicker silicon layer and a top piezoelectric film (e.g., a silicon layer of micrometers), the quality factor would be increased to about 20,000, for example, but this quality factor would still be too low for many applications. With symmetric design described in the disclosure herein, the MEMS resonator may achieve a quality factor of 100,000 or higher at 24 MHz while maintaining a silicon layer with a thickness between 5-30 micrometers, for example.

Furthermore, according to the exemplary embodiment, the piezoelectric layers 212 and 216 (e.g., the AlN layers) can have a thickness between 0.5 and 1.0 micrometers according to the exemplary embodiment, but may have thickness between 200 to 300 nanometers. Preferably, the respective thicknesses of the piezoelectric layers 212 and 216 are substantially the same.

According to the exemplary embodiment, the metal layers 214A, 214B, 218A and 218B (e.g., the molybdenum layers) can have a thickness of approximately 200 nanometers according to the exemplary embodiment, but may have a thickness in the range between 50 to 300 nanometers. Preferably, the respective thicknesses of the metal layers 214A and 218A are substantially the same and the respective thicknesses of the metal layers 214B and 218B are substantially the same. Furthermore, it is contemplated that all four metal layers can have substantially the same thickness for uniform symmetry of the MEMS resonator 200. It should be appreciated that based on the exemplary thickness dimensions described above, the silicon layer 210 (i.e., between 5-30 micrometers) that is thicker than the combination of all metal layers (i.e., 50 to 300 nanometers) and all piezoelectric layers (i.e., between 0.5 and 1.0 micrometers).

Moreover, although the thicknesses of the matching or corresponding layers on top and bottom of the silicon layer 210 (i.e., the piezoelectric layers 212 and 216 and the metal layers 214A, 214B, 218A and 218B) are not so limited, symmetrical design lowers motional impedance and improves the quality factor because the resonator 200 has none or limited movement in the z direction (i.e., the thickness direction) during vibration mode. As a result, the MEMS resonator 200 disclosed herein can be used for certain applications, for example timing devices, gyroscopes, bolometers, and the like, while still having a very thin silicon layer (e.g., 5-30 micrometers).

Moreover, it should be appreciated that the embodiment shown in FIG. 3B is provided to illustrate the symmetrical layering that provides the high quality factor for the device. Thus, after the thin film deposition to form the symmetrical layering of the MEMS resonator 200, it should be understood that the device layers including the metal layers, the piezoelectric layer and the silicon layer can be etched to form the specific resonator shape needed for the desired device. That is, the vertical side surfaces of the silicon layer 210 will be etched during the manufacturing process to form the MEMS resonator 200. As a result, the silicon layer 210 for the resonator is not obstructed or restricted (i.e., it is not mounted to the device by its side surfaces), and, therefore, can vibrate primarily in the lateral direction during excitation of the electrodes as described above. Vibration primarily in the lateral direction means that the magnitude of the motion in lateral direction (i.e., in the lateral X/Y plane) is larger than in thickness direction of the resonator. Ideally, the motion in thickness direction should be minimized in order to obtain a highest possible quality factor. However, due to elastic coupling between lateral and thickness motion, some motion will also inevitably occur in thickness direction. For example, if lateral motion amplitude is 100 nm, the motion of in thickness direction may be 1-10 nm, for example.

Thus, according to the exemplary aspect, the primary mode of vibration means that the MEMS resonator is configured to vibrate in the designed direction (i.e., in the lateral X/Y direction) as described above, with no intended vibration in the vertical direction as described above. As a result, the MEMS resonator 200 as described herein provides a much higher quality factor compared with conventional designs, including MEMS resonators structurally configured to vibrate in the thickness (i.e., vertical) direction.

Moreover, it is contemplated that the term "substantially" as it is used herein takes into account minor variations in the thickness of the corresponding layers that may occur during the manufacturing process. For example, according to one embodiment, the MEMS resonator 200 is designed to have two piezoelectric layers 212 and 216 on opposite sides of the silicon layer 210 that have the same thickness. However, the machines uses to deposit the layers may lead to slight differences in the thickness of the corresponding layers. The use of the term "substantially" to describe the thickness of the corresponding layers takes into account resulting variances in thickness due to variations in the manufacturing equipment.

Furthermore, according to one embodiment, the pair of metal layers 214A and 214B and the pair of metal layers 218A and 218B, both function as pairs of electrodes according to one embodiment. However, manufacturing a MEMS resonator with electrical contacts on the underside of the resonator can be relatively difficult since the manufacturing process requires manufacturing of electrical connections through the silicon layer 210. More particularly, to manufacture such a design, a hole (i.e., a via) needs to be etched though the silicon layer 210 and then lined with an insulating material, such as silicon dioxide. Next, the hole needs to be filled with a conductive material that forms the electoral via from top to the bottom of the resonator 200. Since the silicon layer 210 comprises a thickness between 5-30 micrometers, for example, and preferably between 5-10 micrometers, the via formation can be a significantly more difficult process than making contacts to the electrodes on the top side of the MEMS resonator 200.

Figure 4:
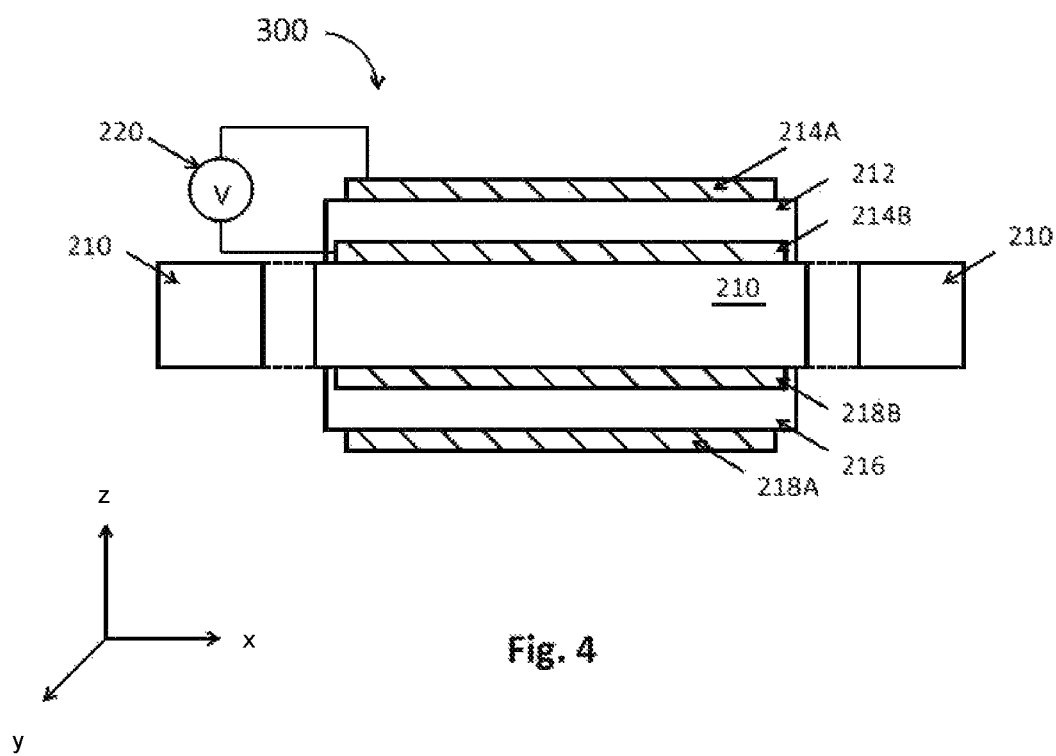
FIG. 4 illustrates a cross-sectional view of an exemplary MEMS resonator according to another exemplary embodiment.

Accordingly, FIG. 4 illustrates a cross-sectional view of an exemplary MEMS resonator 300 according to another exemplary embodiment. As shown, the MEMS resonator 300 according to this embodiment comprises the same symmetrical design discussed above with respect to FIGS. 3A and 3B. Only the points different from the MEMS resonator 200 of the first embodiment will be specifically described.

In particular, as shown in FIG. 4, a voltage source 220 is provided that applies voltage to metal layers 214A and 214B during operation to drive the resonator 300 in continuous motion. The specific operation is known to those skilled in the art and will not be described herein. It should be appreciated that the electronic circuit that provides the voltage source can be in the same physical package (not shown) as the MEMS resonator 300.

As described above, creating electrical connections to the bottom thin films (e.g., metal layers 218A and 218B) is difficult due to manufacturing challenges. Thus, according to the exemplary embodiment of FIG. 4, the thin films 218A and 218B at the bottom of the MEMS resonator 300 are not electrically connected to voltage source 220 or another source. Rather, only the top electrodes (i.e., metal layers 214A and 214B) are electrically connected. As such, the bottom thin films (i.e., metal layers 218A and 218B) are "dummy" actuators that are provided to maintain the resonator symmetry in the thickness direction described above with respect to FIG. 3B.

According to alternative embodiments, it should be appreciated that the pair of second metal layers 218A and 218B can be connected to the voltage source by one or more vias extending through silicon layer 210 as discussed above or by other means as would be understood to one skilled in the art.

Figure 5:
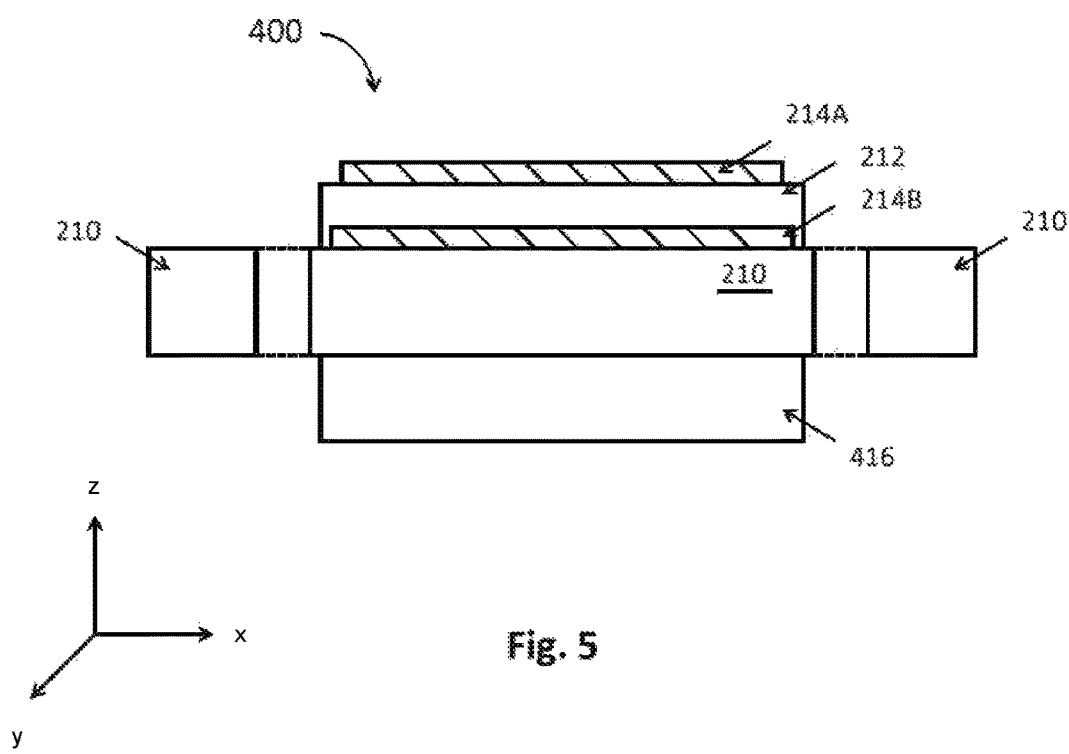
FIG. 5 illustrates a cross-sectional view of an exemplary MEMS resonator according to another exemplary embodiment.

According to yet another embodiment, because the thin films 218A and 218B are not electrically active in the MEMS resonator 300 of FIG. 4, one or more of the thin metal electrodes could be omitted from the underside of the resonator 200 during manufacturing, which would save one or more manufacturing process steps while still improving the symmetry of the MEMS resonator as would be understood to one skilled in the art. FIG. 5 illustrates a cross-sectional view of an exemplary MEMS resonator 400 according to this additional exemplary embodiment.

As shown, the MEMS resonator 400 according to the embodiment shown in FIG. 5 comprises the same symmetrical design discussed above with respect to FIGS. 3A and 3B. Only the points different from the MEMS resonator 200 of the first embodiment will be specifically described. Namely, the MEMS resonator 400 includes a piezoelectric layer 416 at the bottom of the silicon layer 210, but does not include metal films on each side of the piezoelectric layer 416.

Even with no metal films at the bottom, the structure the MEMS resonator 400 provides a design with symmetric characteristics, by selecting film thicknesses above and below the silicon layer 210 such that bottom films combined and top films combined substantially equal mechanical stiffness. In other words, the layers/films deposited on the top and the bottom of the silicon layer are selected so that the combined films have an equal or substantially equal mechanical thickness to create a symmetrical design. Thus, the mechanical stiffness of the top and bottom layers can be selected during the manufacturing process so that the resulting MEMS resonator 400 will not vibrate (or have minimal vibration) in the Z direction when it is excited by a voltage source as described above.

According to an exemplary embodiment, the combined mechanical stiffness can be calculated as $K=E1*h1+E2*h2 \ldots EN*hN$, where $Ei$ is the elastic modulus for each of the films i=1 to N (which can be either the metal films or the piezoelectric layers in the exemplary embodiment) and hi is the respective film thickness for each film. For example, on top of the silicon layer 210, there can be two metal films #1 and #3 with values E1=E3=329 GPa and h1=h3=200 nm and a piezoelectric film disposed therebetween with values of E2=308 GPa and h2=800 nm. As a result, the total stiffness of the combined films on top of the silicon layer 210 will have a value of K=0.378 MPa*m according to this example. Moreover, during the manufacturing process, the similar mechanical film stiffness can be selected at bottom of the silicon layer 210 with a single film (e.g., a piezoelectric film) of E1=308 GPa and h1=1227 nm. In other words, the total stiffness of the combined layers under the silicon (in this case a single layer) is also K=0.378 MPa*m and the elastic modulus and/or thickness can be selected accordingly.

In this exemplary embodiment, since the same material will be used for the piezoelectric layers 212 and 416 (e.g., AlN), the elastic modulus will be the same for the two layers 212 and 416. As a result, only the thickness of the piezoelectric layer 416 will need to be increased to obtain a total thickness that results in a mechanical stiffness that is substantially equal to achieve the symmetrical design of the MEMS resonator 400. In other words, the second piezoelectric layer 416 will have a thickness that is greater than a thickness of the first piezoelectric layer 212 to inhibit (i.e., eliminate or reduce) vibration in a thickness direction (i.e., the z direction) of the MEMS resonator 400 when the pair of first metal layers 214A and 214B are excited by a voltage source. Finally, it should be understood to those skilled in the art that there are many combinations of top and bottom films that achieve the aim of this invention to minimize the z-axis movement by having similar combined film characteristics at the top and bottom of the silicon layer 210.

Again, it is reiterated as described above that the term "substantially" as it is used to describe the similar mechanical stiffness of the combined top and bottom films takes into account minor variations that may occur in the thickness of the corresponding layers during the deposition process and the like. In the exemplary embodiment, it is contemplated that "substantially" equal for the mechanical stiffness of the top and bottom combined layers means that the stiffness is within 10% MPa*m of each other.

In the interest of clarity, not all of the routine features of the embodiments are disclosed herein. It would be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST 200, 300, 400: MEMS resonator
210: silicon layer
212, 216, 416: piezoelectric layer(s)
214A, 214B: first metal layer(s)
218A, 218B: second metal layer(s)
220: voltage source

The invention claimed is:

1. A MEMS resonator etched to vibrate in a lateral direction, the MEMS resonator comprising:
    a silicon layer having a first surface and a second surface opposite the first surface;
    at least one metal layer disposed above the first surface of the silicon layer and at least one corresponding metal layer disposed below the second surface of the silicon layer; and
    a piezoelectric layer disposed above the first surface of the silicon layer and a corresponding piezoelectric layer disposed below the second surface of the silicon layer,
    wherein the respective metal layers and the respective piezoelectric layers are symmetrically disposed about the silicon layer such that the MEMS resonator structurally vibrates in the lateral direction that extends parallel to the first and second surfaces of the silicon layer.

2. The MEMS resonator according to claim 1, wherein vertical sides surfaces of the silicon layer are etched to be unobstructed, such that the MEMS resonator is structurally configured to vibrate primarily in the lateral direction.

3. The MEMS resonator according to claim 1,
    wherein the at least one metal layer comprises a pair of first metal layers with the piezoelectric layer disposed therebetween, and
    wherein the at least one corresponding metal layer comprises a pair of second metal layers with the corresponding piezoelectric layer disposed therebetween.

4. The MEMS resonator according to claim 3, wherein the silicon layer has a thickness greater than a combined thickness of the pairs of first and second metal layers and the piezoelectric layers.

5. The MEMS resonator according to claim 4, wherein the pair of first metal layers and the piezoelectric layer are symmetrically disposed about the silicon layer with respect to the pair of second metal layers and the corresponding piezoelectric layer.

6. The MEMS resonator according to claim 4, wherein the pair of first metal layers is electrically coupled to a voltage source to actuate the MEMS resonator.

7. The MEMS resonator according to claim 6, wherein the pair of second metal layers is electrically coupled to the voltage source.

8. The MEMS resonator according to claim 6, wherein the pair of second metal layers is electrically insulated from the voltage source.

9. The MEMS resonator according to claim 4, wherein the piezoelectric layer comprises a thickness substantially equal to a thickness of the corresponding piezoelectric layer.

10. The MEMS resonator according to claim 9, wherein the pair of first metal layers each comprises a thickness substantially equal to respective thicknesses of the pair of second metal layers.

11. The MEMS resonator according to claim 1,
    wherein the piezoelectric layer comprises a thickness substantially equal to a thickness of the corresponding piezoelectric layer, and wherein the at least one metal layer comprises a thickness substantially equal to a thickness of the at least one corresponding metal layer.

12. The MEMS resonator according to claim 1, wherein the silicon layer comprises a thickness between 5 and 30 micrometers.

13. A MEMS resonator etched to vibrate in a lateral direction, the MEMS resonator comprising:
a silicon layer having a first and second opposing surfaces and etched vertical sides surfaces that are unobstructed, such that the MEMS resonator structurally vibrates primarily in the lateral direction;
a pair of first metal layers disposed above the first surface of the silicon layer;
a first piezoelectric layer disposed between the pair of first metal layers;
a pair of second metal layers symmetrically disposed below the second surface of the silicon layer relative to the pair of first metal layers; and
a second piezoelectric layer disposed between the pair of second metal layers.

14. The MEMS resonator according to claim 13, wherein the respective pairs of metal layers and the respective first and second piezoelectric layers are symmetrically disposed about the silicon layer such that the MEMS resonator is completely symmetrical in a thickness direction and is structurally configured to vibrate primarily in the lateral direction that extends parallel to the first and second opposing surfaces of the silicon layer.

15. The MEMS resonator according to claim 13, wherein the pair of first metal layers is electrically coupled to a voltage source to actuate the MEMS resonator.

16. The MEMS resonator according to claim 15, wherein the pair of second metal layers is electrically insulated from the voltage source.

17. The MEMS resonator according to claim 13, wherein the silicon layer comprises a thickness between 5 and 30 micrometers and that is greater than a combined thickness of the pairs of first and second metal layers and the piezoelectric layers.

18. A MEMS resonator etched to vibrate in a lateral direction, the MEMS resonator comprising:
a silicon layer having a first surface, a second surface opposite the first surface, and vertical sides surfaces that are unobstructed, such that the MEMS resonator structurally vibrates primarily in the lateral direction;
a pair of first metal layers disposed above the first surface of the silicon layer;
a first piezoelectric layer having a first thickness disposed between the pair of first metal layers; and
a second piezoelectric layer disposed below the second surface of the silicon layer,
wherein the second piezoelectric layer comprises a second thickness greater than the first thickness of the first piezoelectric layer to inhibit vibration in a thickness direction of the MEMS resonator when the pair of first metal layers are excited by a voltage source.

19. The MEMS resonator according to claim 18, wherein the pair of first metal layers and the first piezoelectric layer have a combined mechanical stiffness that is substantially equal to a mechanical stiffness of the second piezoelectric layer.

20. The MEMS resonator according to claim 19, wherein the combined mechanical stiffness of the pair of first metal layers and the first piezoelectric layer is within 10% MPa*m of the mechanical stiffness of the second piezoelectric layer.

21. The MEMS resonator according to claim 1, wherein the silicon layer is directly coupled by at least one connecting arm to a frame that surrounds the silicon layer in the lateral direction.

* * * * *